(12) United States Patent
Tsai et al.

(10) Patent No.: US 8,216,906 B2
(45) Date of Patent: Jul. 10, 2012

(54) METHOD OF MANUFACTURING INTEGRATED CIRCUIT DEVICE WITH WELL CONTROLLED SURFACE PROXIMITY

(75) Inventors: Ming-Huan Tsai, Zhubei (TW); Hui Ouyang, Chubei (TW); Chun-Fai Cheng, Hsinchu (TW); Wei-Han Fan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 12/827,344

(22) Filed: Jun. 30, 2010

(65) Prior Publication Data

US 2012/0001238 A1 Jan. 5, 2012

(51) Int. Cl.
*H01L 21/336* (2006.01)

(52) U.S. Cl. ........ 438/304; 438/301; 438/303; 438/306; 438/E21.619

(58) Field of Classification Search ............ 438/222, 438/285, 294, 299, 301–306
See application file for complete search history.

(56) References Cited

U.S. PATENT DOCUMENTS

| | | | |
|---|---|---|---|
| 5,413,945 A | 5/1995 | Chien et al. | |
| 5,650,340 A | 7/1997 | Burr et al. | |
| 6,133,082 A | 10/2000 | Masuoka | |
| 6,214,679 B1 * | 4/2001 | Murthy et al. | 438/299 |
| 6,579,770 B2 | 6/2003 | Rodder et al. | |
| 6,585,841 B1 | 7/2003 | Popp et al. | |
| 7,078,285 B1 | 7/2006 | Suenaga | |
| 7,148,097 B2 | 12/2006 | Yu et al. | |
| 7,195,985 B2 | 3/2007 | Murthy et al. | |
| 7,479,432 B2 * | 1/2009 | Murthy et al. | 438/300 |
| 7,494,858 B2 | 2/2009 | Bohr et al. | |
| 2006/0185135 A1 | 8/2006 | Yamamoto et al. | |
| 2007/0105331 A1 * | 5/2007 | Murthy et al. | 438/341 |
| 2010/0311218 A1 | 12/2010 | Fukutome et al. | |

FOREIGN PATENT DOCUMENTS

| | | |
|---|---|---|
| JP | 2003-033201 | 2/1991 |
| JP | 2006-141642 | 6/2006 |

OTHER PUBLICATIONS

Unpublished U.S. Appl. No. 12/981,610, filed Dec. 30, 2010, entitled "Method of Manufacturing Source/Drain Structures," 29 pages.
Unpublished U.S. Appl. No. 12/816,519, filed Jun. 16, 2010, entitled "Integrated Circuit Device with Well Controlled Surface Proximity and Method of Manufacturing Same," 58 pages.
Unpublished U.S. Appl. No. 13/183,043, filed Jul. 15, 2011, entitled "Self-Aligned source and Drain Structures and Method of Manufacturing Same," 25 pages.

(Continued)

*Primary Examiner* — Dung A. Le
(74) *Attorney, Agent, or Firm* — Haynes and Boone, LLP

(57) ABSTRACT

An integrated circuit device and method for manufacturing the integrated circuit device is disclosed. The disclosed method provides improved control over a surface proximity and tip depth of integrated circuit device. In an embodiment, the method achieves improved control by forming a lightly doped source and drain (LDD) region that acts as an etch stop. The LDD region may act as an etch stop during an etching process implemented to form a recess in the substrate that defines a source and drain region of the device.

17 Claims, 12 Drawing Sheets

OTHER PUBLICATIONS

Unpublished U.S. Appl. No. 12/913041, filed Oct. 27, 2010, entitled "Method of Manufacturing Source/Drain Structure," 25 pages.

Flamm, Daniel L., "Mechanisms of Silicon Etching in Fluorine-and-Chlorine-Containing Plasmas," Pure & Appl. Chem., vol. 62, No. 9, pp. 1709-1720, 1990.

Li, Y.X., et al., "Fabrication of a Single Crystalline Silicon Capacitive Lateral Accelerometer Using Micromachining Based on Single Step Plasma Etching," 0-7803-2503-6, 1995, IEEE, pp. 398-403.

Kovacs, Gregory T. A., et al., "Bulk Micromachining of Silicon," Proceedings of the IEEE, vol. 86, No. 8, Aug. 1998, pp. 1536-1551.

* cited by examiner

METHOD OF MANUFACTURING INTEGRATED CIRCUIT DEVICE WITH WELL CONTROLLED SURFACE PROXIMITY

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to try and further improve transistor device performance. Although existing approaches have been generally adequate for their intended purposes, they have not been entirely satisfactory in all respects.

SUMMARY

The present disclosure provides for many different embodiments. One of the broader forms of an embodiment of the present invention involves a method that includes: providing a semiconductor substrate; forming a gate structure over the substrate; forming a lightly doped source and drain (LDD) region in the substrate, the LDD region being interposed by the gate structure; forming offset spacers on sidewalls of the gate structure; removing portions of the substrate, including portions of the LDD regions, at either side of the gate structure, thereby forming a first recess in the substrate; epitaxially (epi) growing a first semiconductor material to fill the first recess, thereby forming epi features; forming main spacers for the gate structure; removing portions of the substrate, including portions of the epi features, at either side of the gate structure, thereby forming a second recess in the substrate that defines a source and drain region in the substrate; and epitaxially (epi) growing a second semiconductor material to fill the second recess, the second semiconductor material being different than the first semiconductor material.

Another one of the broader forms of an embodiment of the present invention involves a method that includes: providing a semiconductor substrate having a first region and a second region; forming first and second gate structures over the substrate in the first and second regions, respectively; forming first and second lightly doped source and drain (LDD) region in the first and second regions, respectively; forming offset spacers on sidewalls of the first and second gate structures; forming a first recess in the substrate at either side of the second gate structure; epitaxially (epi) growing a first semiconductor material to fill the first recess and over the first LDD region; forming main spacers for the first and second gate structures; forming a second recess in the substrate at either side of the second gate structure; and epitaxially (epi) growing a second semiconductor material to fill the second recess, the second semiconductor material being different than the first semiconductor material.

According to another of the broader forms of the invention, an integrated circuit device includes: a semiconductor substrate; a gate stack disposed over the substrate; and spacers disposed on sidewalls of the gate stack. The integrated circuit device further includes a lightly doped source and drain (LDD) region and an epitaxially (epi) grown source and drain (S/D) in the substrate, where the LDD and epi grown S/D regions are interposed by the gate structure. The epi source region and the epi drain region are each defined by a first and second facet in a {111} crystallographic plane of the substrate and a third facet in a {100} crystallographic plane of the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
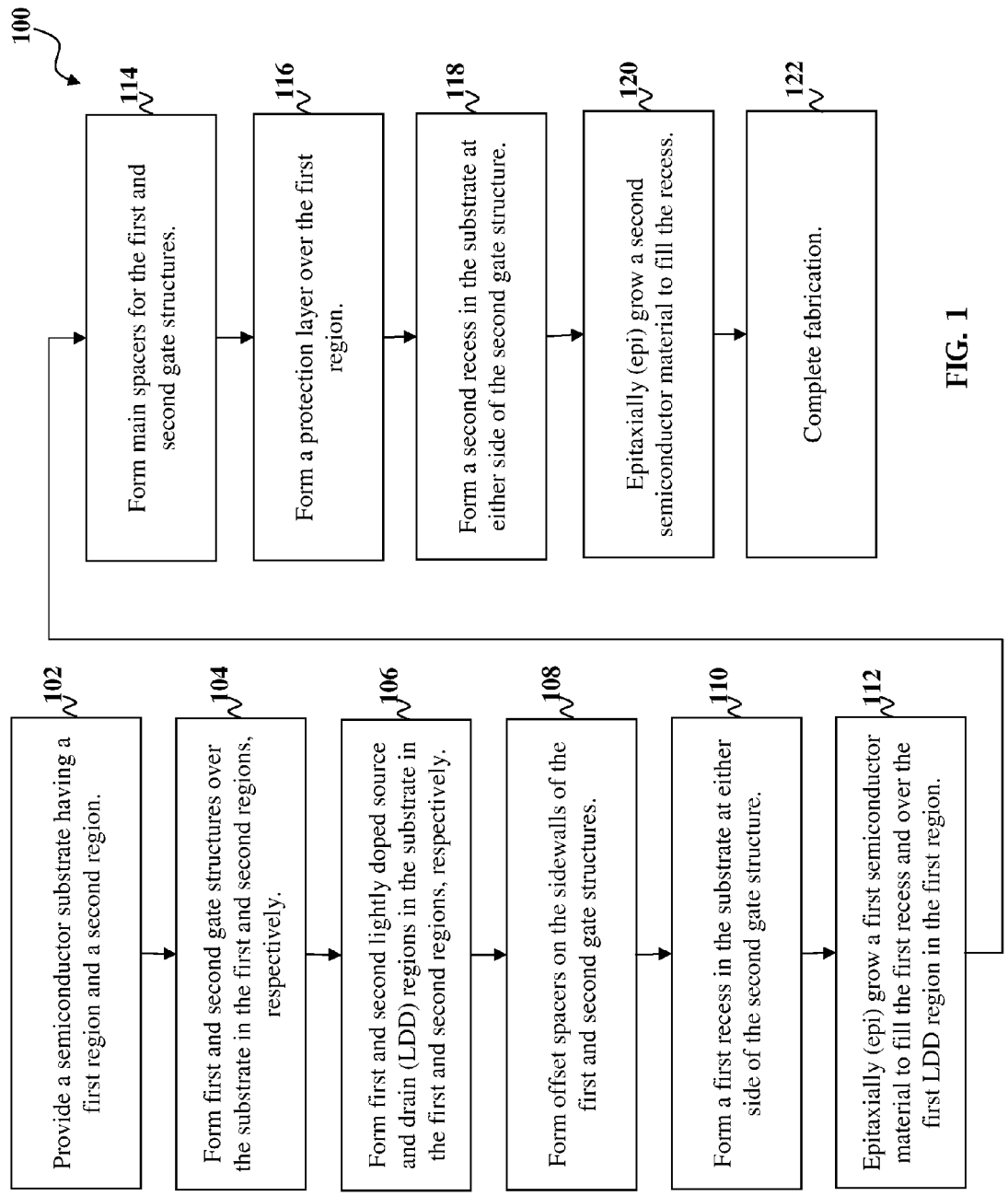
FIG. 1 is a flow chart of a method for fabricating an integrated circuit device according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 102 where a semiconductor substrate having first and second regions is provided. At block 104, first and second gate structures are formed over the substrate in the first and second regions, respectively. At block 106, first and second lightly doped source and drain (LDD) regions are formed in the substrate in the first and second regions, respectively. The method continues with block 108 where offset spacers are formed on the sidewalls of the first and second gate structures. At block 110, a first recess is formed in the substrate at either side of the second gate structure in the second region. The first recess may be formed by removing portions of the substrate and second LDD region, for example, by an etching process. While forming the first recess, the first region of the substrate may be protected, or alternatively, a recess may be formed simultaneously at either side of the first gate structure in the first region. At block 112, a first semiconductor material is epitaxially grown to fill the first recess, thereby forming epi features. The first semiconductor material is also grown over the first LDD region in the first region, thereby forming source/drain regions in the first region. Alternatively, where a recess is also formed in the first region, the recess in the first region is also filled with the first semiconductor material.

The method 100 at block 114 includes forming main spacers for the first and second gate structures. The main spacers may be formed adjacent the offset spacers. At blocks 116 and 118, a protection layer is formed over the first region and a second recess is formed in the substrate at either side of the second gate structure. The second recess may be formed by removing portions of the substrate and the epi features. At block 120, a second semiconductor material is epitaxially grown to fill the second recess, thereby forming source and drain regions for the second region. The method 100 continues with block 122 where fabrication of the integrated circuit device is completed. Additional steps can be provided before, during, and after the method 100, and some of the steps described can be replaced or eliminated for additional embodiments of the method. The discussion that follows illustrates various embodiments of an integrated circuit device that can be fabricated according to the method 100 of FIG. 1.

FIGS. 2-11 are various diagrammatic cross-sectional views of an embodiment of an integrated circuit device 200 during various fabrication stages according to the method 100 of FIG. 1. FIGS. 2-11 have been simplified for the sake of clarity to better understand the inventive concepts of the present disclosure. In the depicted embodiment, as will be further discussed below, the integrated circuit device 200 includes field effect transistor devices, specifically an n-channel field effect transistor (NFET) and a p-channel field effect transistor (PFET). The integrated circuit device 200 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
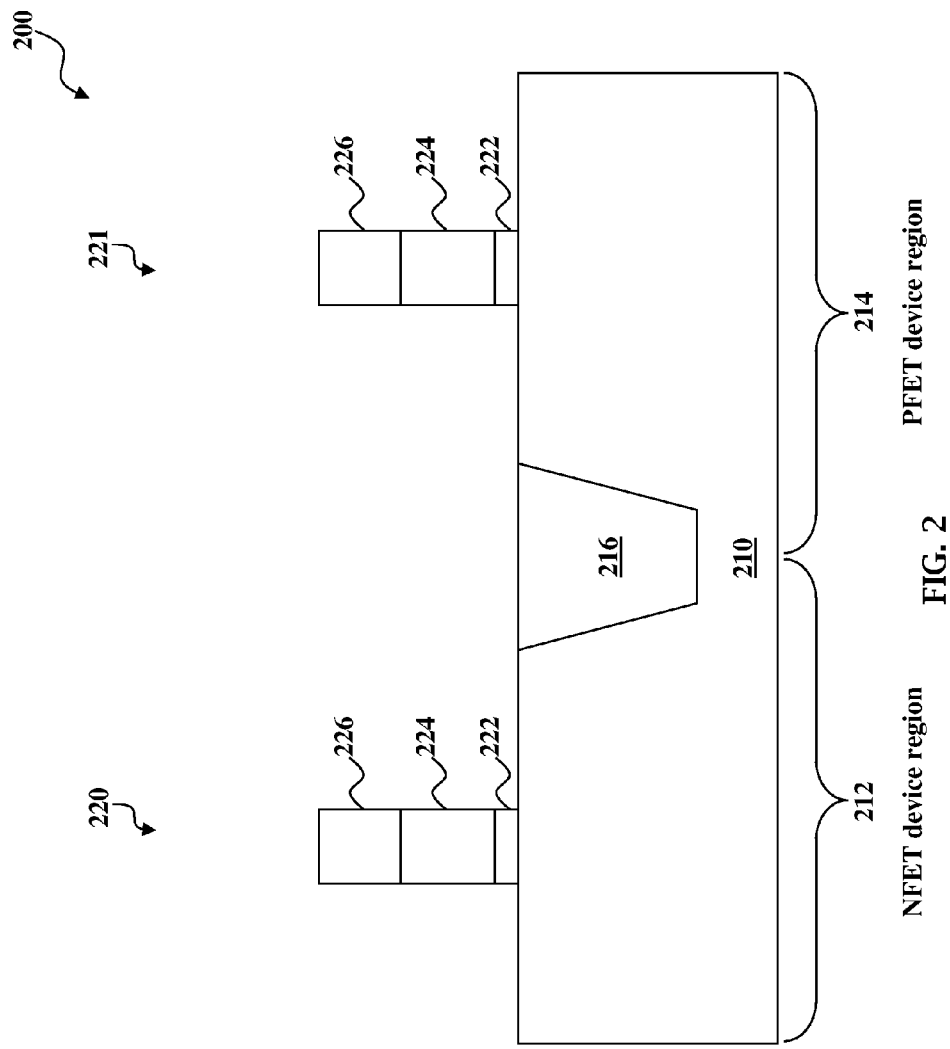
FIGS. 2-11 are various diagrammatic cross-sectional views of an embodiment of an integrated circuit device during various fabrication stages according to the method of FIG. 1.

In FIG. 2, a substrate 210 is provided. In the depicted embodiment, the substrate 210 is a semiconductor substrate including silicon. The substrate may be a p-type or n-type substrate. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 includes various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The integrated circuit device 200 includes a device region 212 and another device region 214 of the substrate 210, and thus, the substrate 210 may include various doped regions configured for a particular device in each region 212 and 214. In the depicted embodiment, the NFET will be formed in the device region 212, which is referred to as an NFET device region, and the PFET device will be formed in the device region 214, which is referred to as a PFET device region. Accordingly, the device region 212 may include a doped region configured for an NFET device, and the device region 214 may include a doped region configured for a PFET device.

Isolation feature 216 is formed in the substrate 210 to isolate various regions of the substrate 210, such as device regions 212 and 214. The isolation feature 216 also isolates the device regions 212 and 214 from other devices (not shown). The isolation feature 216 utilizes isolation technology, such as local oxidation of silicon (LOCOS) and/or shallow trench isolation (STI), to define and electrically isolate the various regions. The isolation feature 216 comprises silicon oxide, silicon nitride, silicon oxynitride, other suitable materials, or combinations thereof. The isolation feature 216 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The integrated circuit device 200 includes a gate structure 220 for the NFET device and a gate structure 221 for the PFET device. The gate structure 220 is disposed over the substrate 210 in NFET device region 212, and the gate structure 221 is disposed over the substrate 210 in PFET device region 214. In the depicted embodiment, the gate structures 220 and 221 include a gate dielectric layer 222, a gate layer 224 (referred to as a gate electrode), and a hard mask layer 226. The gate dielectric layer 222, gate layer 224, and hard mask layer 226 form gate stacks for the gate structures 220 and 221. The gate stacks 220 and 221 may include additional layers as is known in the art. The gate structures 220 and 221 are formed by deposition, lithography patterning, etching processes, or combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the photolithography exposing process is implemented or replaced by other proper methods, such as maskless photolithography, electron-beam writing, or ion-beam writing. The etching processes include dry etching, wet etching, other etching methods, or combinations thereof. The gate structures 220 and 221 may be formed simultaneously, utilizing the same processing steps and processing materials; independently of one another, utilizing varying processing steps and processing materials; or using a combination of simultaneous and independent processing steps and processing materials.

The gate dielectric layer 222 is formed over the substrate 210 and includes a dielectric material, such as silicon oxide, silicon oxynitride, silicon nitride, a high-k dielectric material, or combinations thereof. Exemplary high-k dielectric materials include $HfO_2$, HfSiO, HfSiON, HfTaO, HfTiO, HfZrO, other suitable materials, or combinations thereof. The gate dielectric layer 222 may include a multilayer structure. For example, the gate dielectric layer 222 may include an interfacial layer, and a high-k dielectric layer formed on the interfacial layer. An exemplary interfacial layer may be a grown silicon oxide layer formed by a thermal process or ALD process.

The gate layer 224 is formed over the gate dielectric layer 222. In the present embodiment, the gate layer 224 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 224 could include a conductive layer having a proper work function, therefore, the gate layer 224 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate layer 224 may include other conductive materials, such as aluminum, copper, tungsten, metal alloys, metal silicide, other suitable materials, or combinations thereof. For example, where the gate layer 224 includes a work function layer, another conductive layer can be formed over the work function layer.

The hard mask layer 226 is formed over the gate layer 224. The hard mask layer 226 includes silicon oxide, silicon nitride, silicon oxynitride, silicon carbide, other suitable dielectric material, or combinations thereof. The hard mask layer 226 may have a multi-layer structure.

Figure 3:
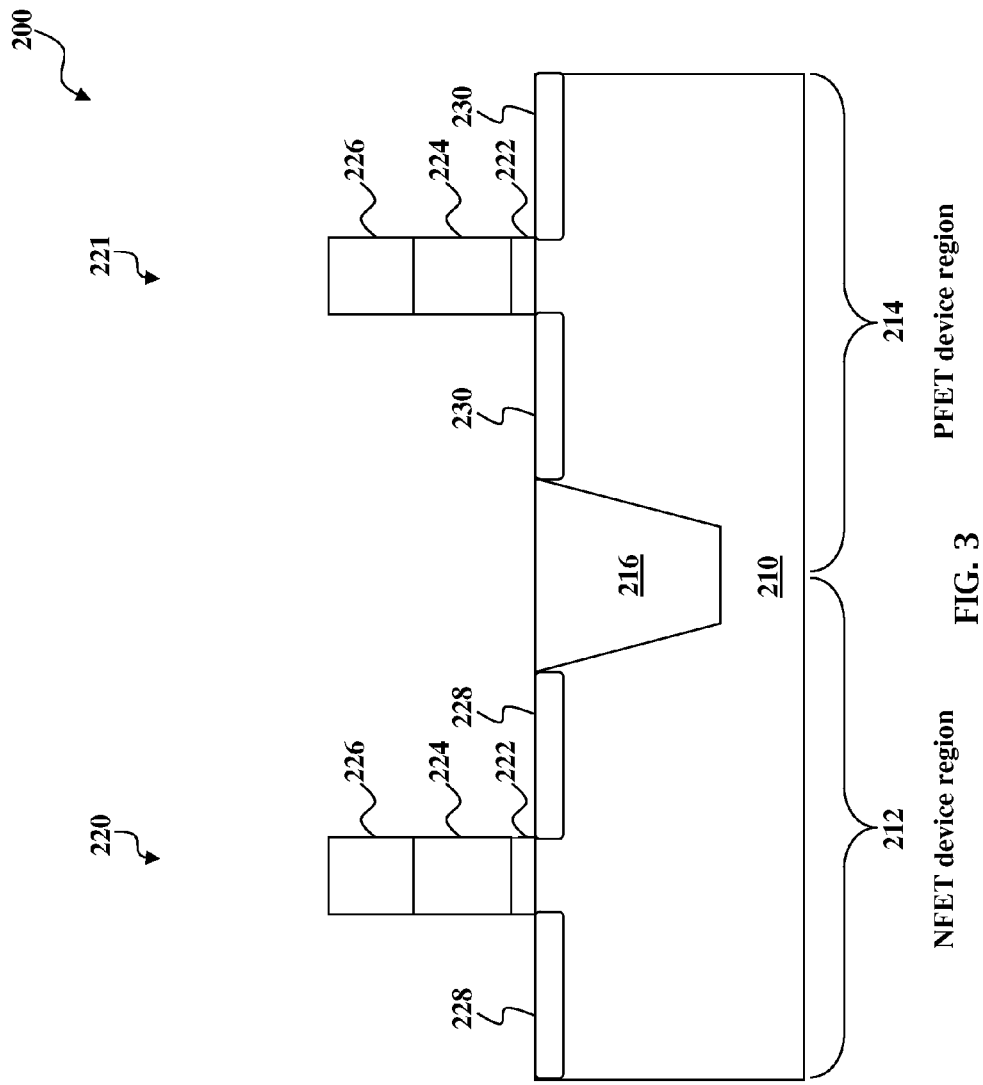

In FIG. 3, lightly doped source/drain (LDD) regions are formed in source and drain regions of the substrate 210 in the device regions 212 and 214. In the depicted embodiment, LDD regions 228 are formed in the substrate 210, interposed by the gate structure 220, in the NFET device region 212; and LDD regions 230 are formed in the substrate 210, interposed by the gate structure 221, in the PFET device region 214. The LDD regions 228 and 230 are aligned with the sidewalls of the gate stacks of the gate structures 220 and 221. The LDD regions 228 and 230 are formed by an ion implantation process, diffusion process, other suitable process, or combination thereof. The PFET device region 214 may be protected during formation of the LDD regions 228 in the NFET device region 212, and the NFET device region 212 may be protected during formation of the LDD regions 230 in the PFET device region 214. For example, a photoresist layer or hard mask layer may be deposited and patterned over the PFET device region 214 during formation of the LDD regions 228 in the NFET device region 212, and a photoresist layer or hard mask layer can be deposited and patterned over the NFET device region 212 during formation of the LDD regions 230 in the PFET device region 214. In the depicted embodiment, the LDD regions 228 for the NFET device (NLDD) are doped with an n-type dopant, such as phosphorous or arsenic, and the LDD regions 230 for the PFET device (PLDD) are doped with a p-type dopant, such as boron or $BF_2$.

Figure 4:
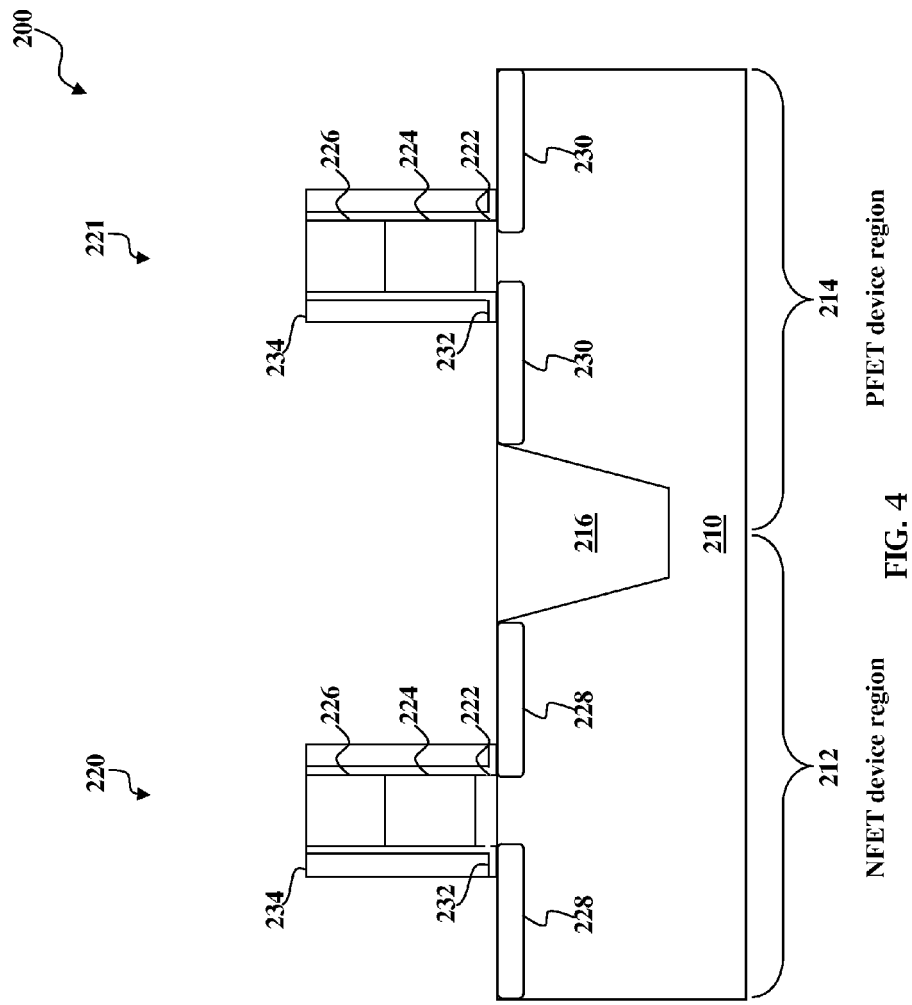

In FIG. 4, spacer liner 232 and offset (dummy) spacers 234 may be formed for the gate structures 220 and 221. In the depicted embodiment, the spacer liner 232 comprises an oxide material, such as silicon oxide, and the offset spacers 234 comprise a nitride material, such as silicon nitride. Alternatively, the offset spacers 232 includes another suitable dielectric material, such as silicon oxide, silicon oxynitride, or combinations thereof. The spacer liner 232 may also comprise another suitable dielectric material. The spacer liner 232 and offset spacers 234 are formed by a suitable process. For example, the spacer liner 232 and offset spacers 224 are formed by blanket depositing a first dielectric layer (a silicon oxide layer) over the integrated circuit device 200 and a second dielectric layer (a silicon nitride layer) over the first dielectric layer, and then, anisotropically etching to remove the dielectric layers to form the spacer liner 232 and offset spacers 234 as illustrated in FIG. 4. The spacer liner 232 and offset spacers 234 are positioned adjacent the sidewalls of the gate stacks (gate dielectric layer 222, gate layer 224, and hard mask layer 226) of the gate structures 220 and 221.

Figure 5:
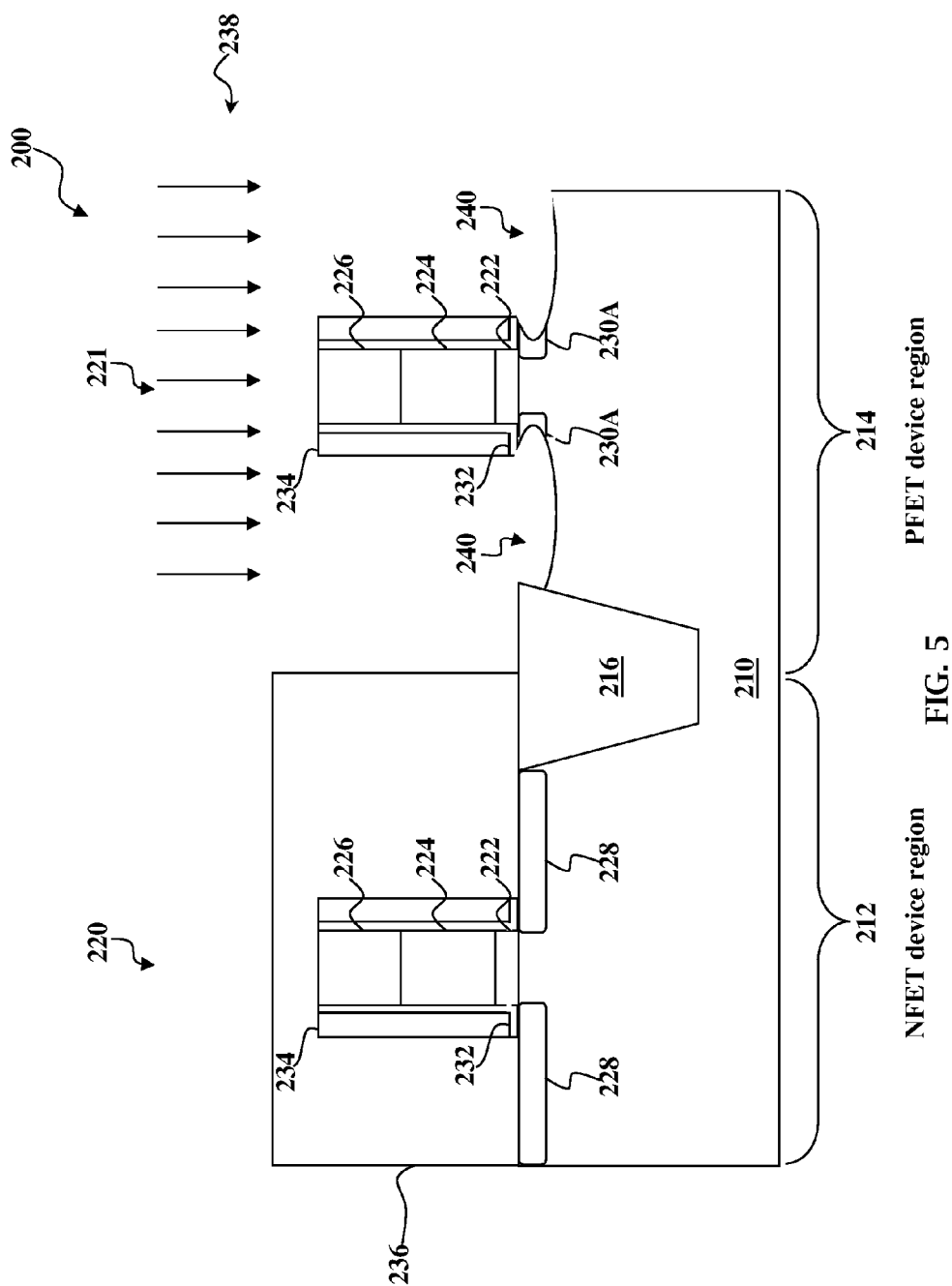

In FIG. 5, portions of the substrate 210 are removed at either side of the gate structure 221 in the PFET device region 214, particularly in the source and drain region of the PFET device. In the depicted embodiment, a patterned photoresist layer 236 is formed over the integrated circuit device 200 to protect the NFET device during processing of the PFET device region 214. The patterned photoresist layer 236 may be formed by a photolithography process. An exemplary photolithography process may includes processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint. The patterned photoresist layer 236 may include an antireflective coating layer, such as a bottom antireflective coating (BARC) layer and/or a top antireflective coating (TARC) layer.

Figure 6:
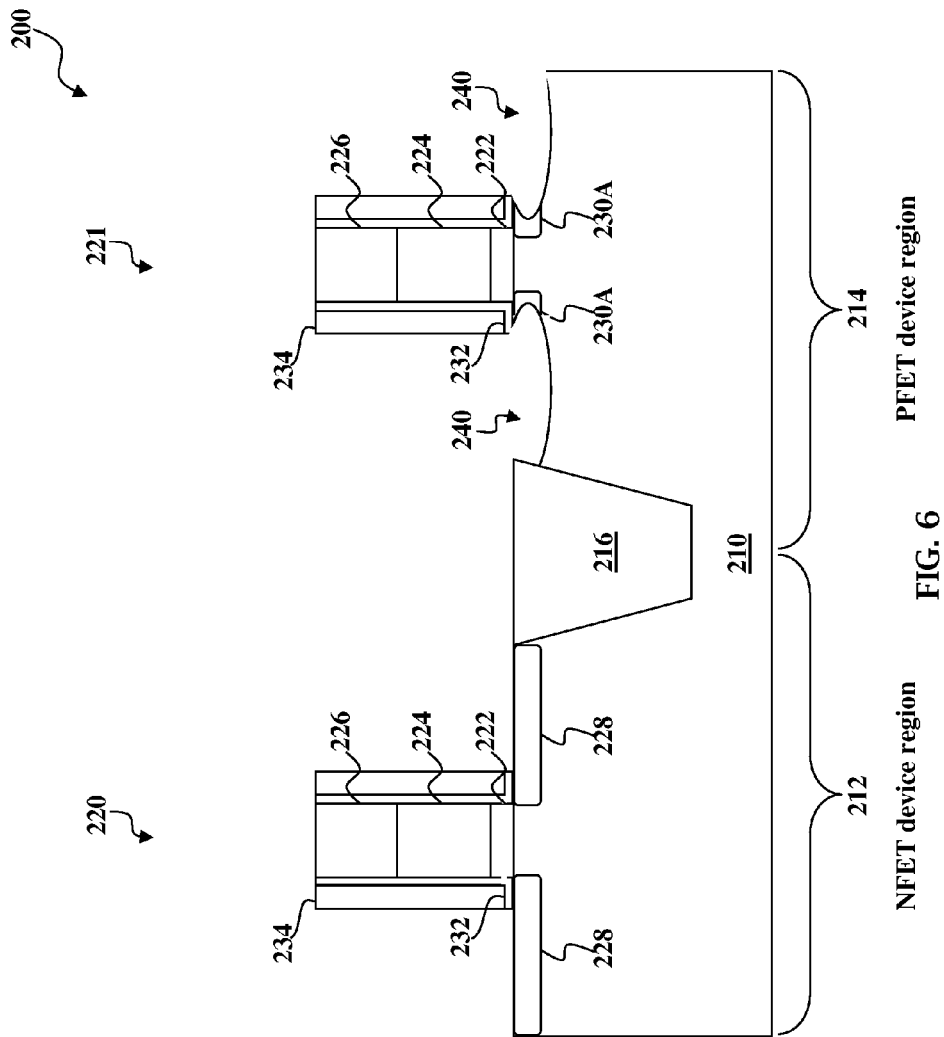

An etching process 238 then removes portions of the substrate 210, including portions of the LDD regions 230, to form LDD region 230A and recesses 240 in the substrate 210. The recesses 240 are formed in the source and drain regions of the PFET device in the PFET device region 214. In the depicted embodiment, the etching process 238 is a dry etching process. As further discussed below, the etching process 238 is controlled to achieve a desired LDD region 230A profile, such as that illustrated in FIG. 5. In an embodiment, the dry etching process has etching parameters that can be tuned, such as etchants used, etching pressure, source power, radio-frequency (RF) bias voltage, RF bias power, etchant flow rate, and other suitable parameters. For example, an etching pressure of about 1 mT (mili-Torr) to about 200 mT may be used, a source power of about 200 W (Watts) to about 2000 W, and an etchant that includes $NF_3$, $Cl_2$, $SF_6$, He, Ar, $CF_4$, or combinations thereof may be used. In an example, the etching process 238 includes an etching pressure of about 1 mT to about 200 mT, a source power of about 200 W to about 2000 W, an RF bias voltage of about 0 V (Volts) to about 100 V, a $NF_3$ gas flow of about 5 sccm (standard cubic centimeters per minute) to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process 238 includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process 238 includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The etching profile of the recesses 240 exhibit a suitable depth. For example, the recesses 240 have a depth from about 15 nanometers (nm) to about 25 nm. After the etching process, a pre-cleaning process may be performed to clean the recesses 240 with a hydrofluoric acide (HF) solution or other suitable solution. Thereafter, the patterned photoresist layer 236 is removed by a photoresist stripping process, for example, as illustrated in FIG. 6. In an alternate embodiment, the patterned photoresist layer 236 is omitted, and the etching process 238 simultaneously forms recesses 240 and recesses (trenches) for a source and drain feature in the NFET device region 212.

Figure 7:
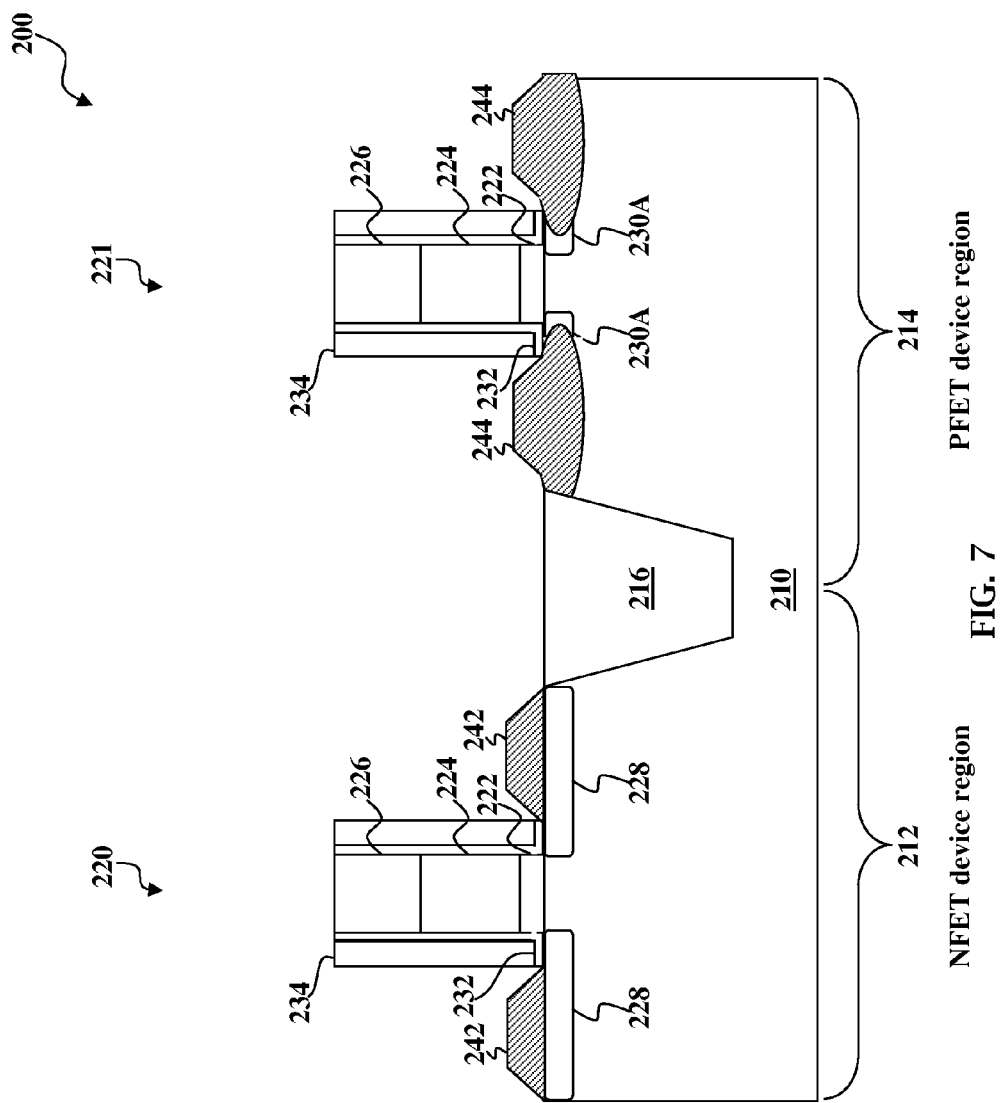

In FIG. 7, an epitaxial (epi) process is performed to grow a semiconductor material on the substrate 210. In the depicted embodiment, the semiconductor material is silicon grown by a selective epitaxy growth (SEG) process. The epi silicon forms source and drain features 242 (referred to as raised source and drain regions) in the NFET device region 212 and fills the recesses 240 to form epi features 244 in the PFET device region 214. Alternatively, the epi process may include CVD deposition techniques (e.g., vapor-phase epitaxy (VPE) and/or ultra-high vacuum CVD (UHV-CVD)), molecular beam epitaxy, other suitable processes, or combination thereof. The epitaxial process may use gaseous and/or liquid precursors, which may interact with the composition of the substrate 210. It should be noted that the epi features 244 enhance an etching rate between the epi features 244 and the LDD region 230A. The Si epi source and drain features 242 of the NFET device associated with the gate structure 220 may be in-situ doped or undoped during the epi process. For example, the Si epi source and drain features 242 may be doped with phosphorous to form Si:P source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 242 may further be exposed to annealing processes, such as a rapid thermal annealing process.

Figure 8:
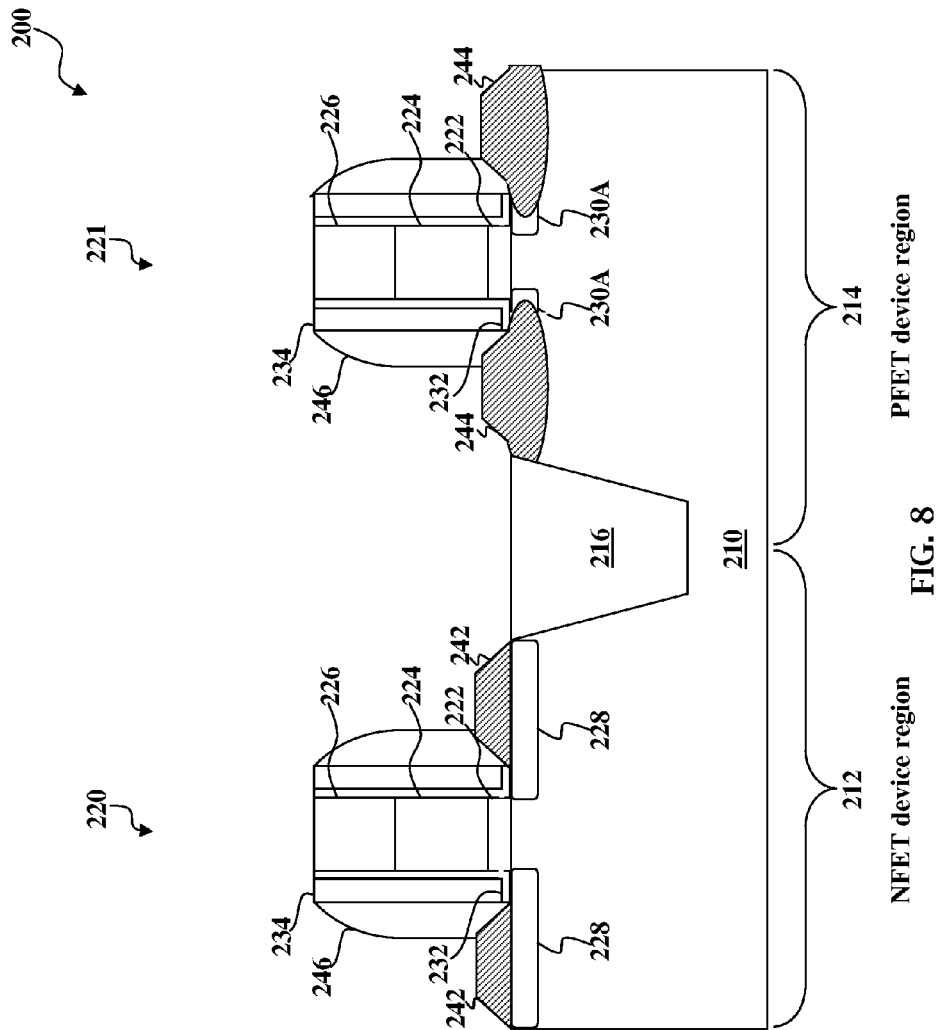

In FIG. 8, spacers 246 (referred to as main spacers) are formed for the gate structures 220 and 221 by a suitable process. For example, the spacers 246 are formed by blanket depositing a dielectric layer, such as a silicon nitride layer, over the integrated circuit device 200, and then, anisotropically etching to remove the dielectric layer to form the spacers 246 as illustrated in FIG. 8. The spacers 246 are positioned on the sidewalls of the gate structures 220 and 221, and in the depicted embodiment, adjacent the offset spacers 234. The spacers 246 comprise a dielectric material, such as silicon nitride, silicon oxide, silicon oxynitride, other suitable materials, or combinations thereof.

Figure 9A:
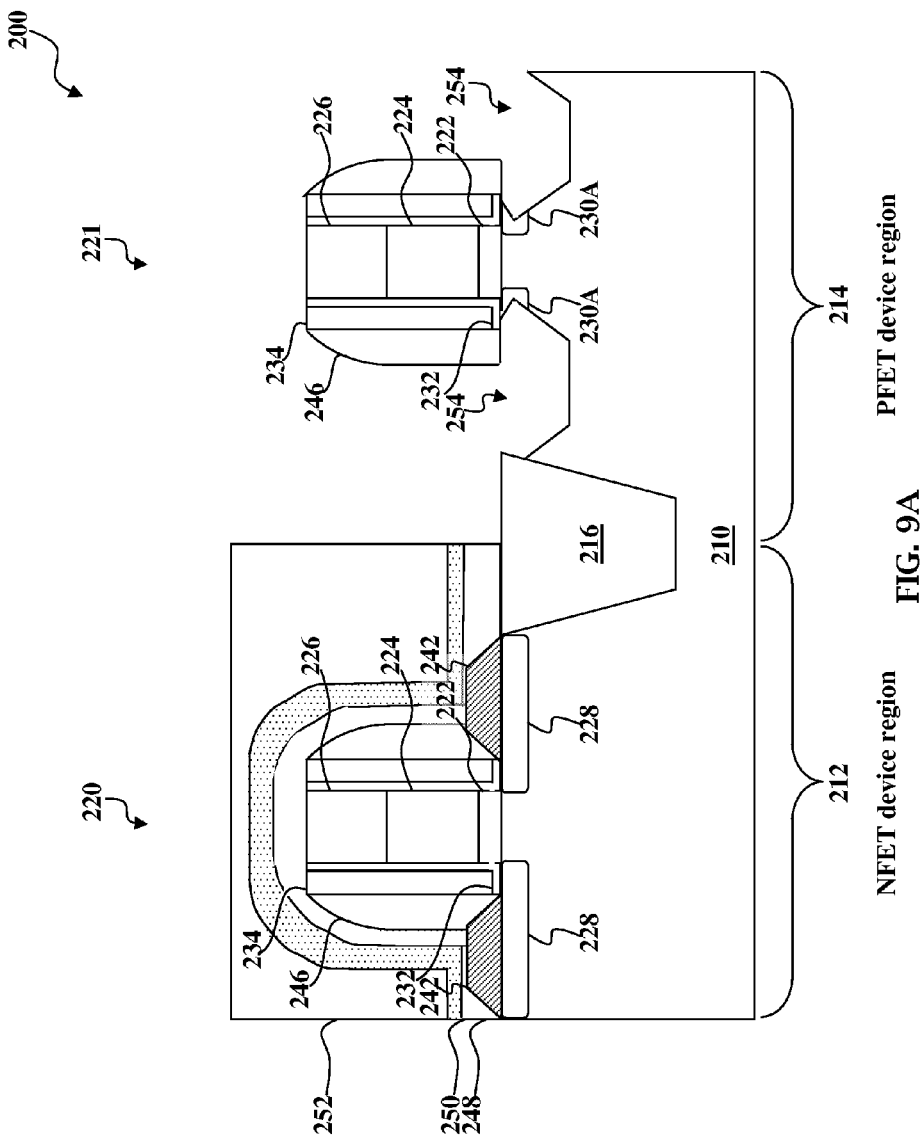

In FIG. 9A, portions of the substrate 210 are removed at either side of the gate structure 221 in the PFET device region 214, particularly in the source and drain region of the PFET device. In the depicted embodiment, a capping layer 248, another capping layer 250, and a photoresist layer 252 are formed over the integrated circuit device 200 and patterned to protect the NFET device during processing of the PFET device region 214. The capping layer 248 may comprise an oxide material, and capping layer 250 may comprise a nitride material. The capping layers 248 and 250 may comprise other suitable materials as known in the art. The photoresist layer 252 may include an antireflective coating layer, such as a bottom antireflective coating (BARC) layer and/or a top antireflective coating (TARC) layer. The patterned layers 248, 250, and 252 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 210, including the epi features 244 and LDD region 230A, to form recesses 254 in the substrate 210. The recesses 254 are formed in the source and drain regions of the PFET device in the PFET device region 214. The etching process includes a dry etching process, wet etching process, or combination thereof. In the depicted embodiment, the etching process utilizes a combination dry and wet etching. The etching process is controlled to achieve a desired etching profile, such as that illustrated in FIG. 9A. In an embodiment, the dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. (for example, to form a {111} facet). In another example, the wet etching process first implements a 100:1 concentration of an HF solution at room temperature, and then implements a TMAH solution at a temperature of about 20° C. to about 60° C. (for example, to form a {111} facet). After the etching process, a pre-cleaning process may be performed to clean the recesses 254 with a hydrofluoric acid (HF) solution or other suitable solution.

Figure 9B:
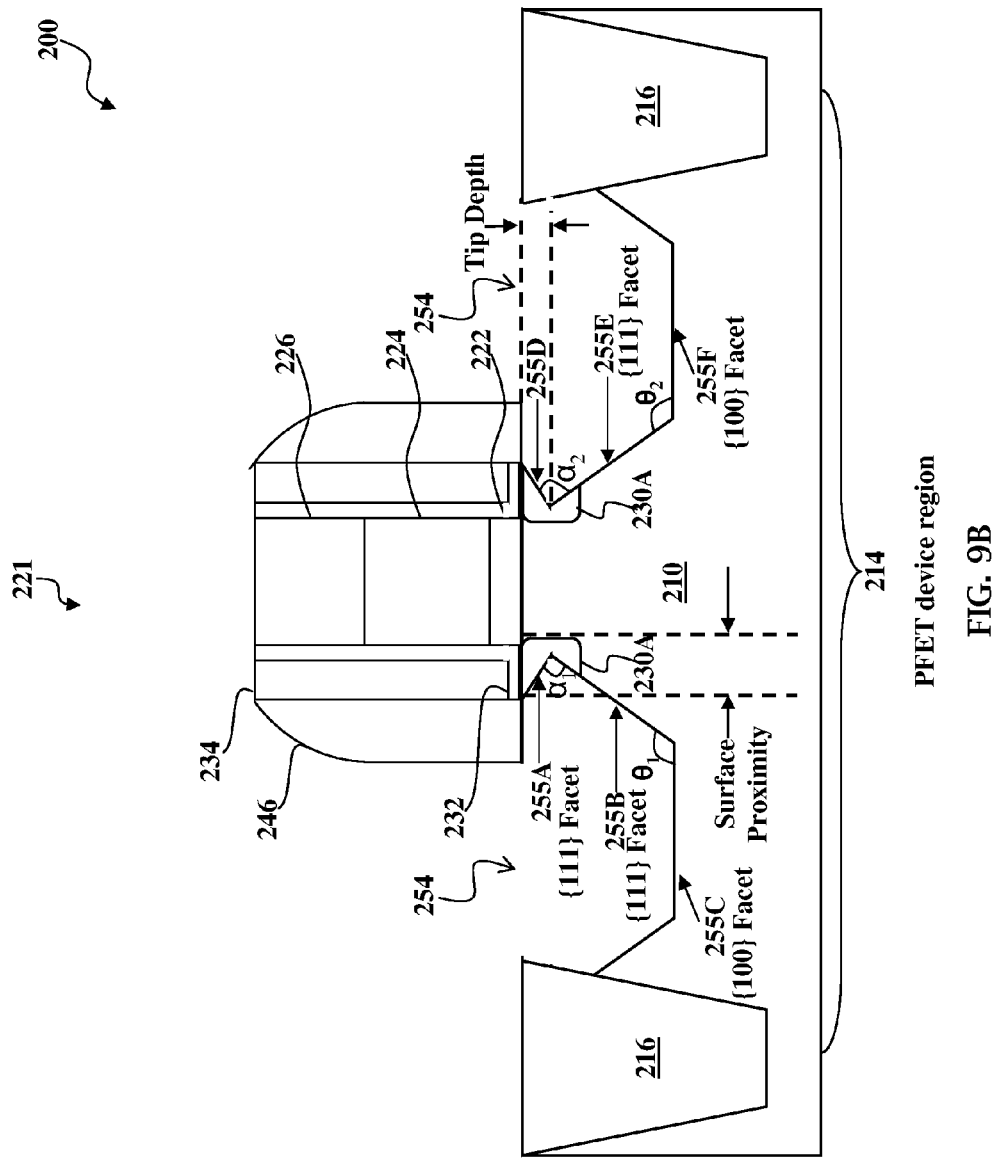

The etching profile of the recesses 254 enhances performance of the integrated circuit device 200. In FIG. 9B, the PFET device region 214 of the integrated circuit device 200 is enlarged for better understanding of the etching profile of recesses 254. The etching profile of the recesses 254 defines source and drain regions of the PFET device, and the etching profile of the recesses is defined by facets 255A, 255B, 255C, 255D, 255E, and 255F of the substrate 210. The facets 255A, 255B, 225D, and 255E may be referred to as shallow facets, and the facets 255C and 255F may be referred to as bottom facets. In the depicted embodiment, the etching profile of the recesses 254 is defined by facets 255A, 255B, 255D, and 255E in a {111} crystallographic plane of the substrate 210, and facets 255C and 255F in a {100} crystallographic plane of the substrate 210. An angle $\alpha_1$ between the shallow facets 255A and 255B of the substrate 210 is from about 45.0° to about 80.0°, and an angle $\theta_1$ between the facets 255B and 255C of the substrate 210 is from about 50.0° to about 70.0°. An angle $\alpha_2$ between the shallow facets 255C and 255D of the substrate 210 is from about 45.0° to about 80.0°, and an angle $\theta_2$ between the facets 255E and 255F of the substrate 210 is from about 50.0° to about 70.0°. In the depicted embodiment, $\alpha_1$ and $\alpha_2$ are about 54.7°, and $\theta_1$ and $\theta_2$ are about 54.7°.

The recesses 254 further define a surface proximity and a tip depth (or height). The surface proximity defines a distance that a top surface of the substrate 210 extends from a sidewall of the gate structure (i.e., gate stack including gate dielectric layer 222, gate layer 224, and hard mask layer 226) to the recess 254 (or when the recess is filled, a source and drain feature). In the depicted embodiment, the disclosed etching profile of the recesses 254 achieves a surface proximity of about 1 nm to about 3 nm. The tip depth defines a distance between a top surface of the substrate 210 and an intersection of the facets 255A and 255B (or an intersection of the facets 255D and 255E). In the depicted embodiment, the etching profile of the recesses 254 achieves a tip depth of about 5 nm to about 10 nm.

The etching profile of the recesses 254, which improves device performance, is achieved by the method 100 described herein. Typically, to enhance the performance of integrated circuit device 200, a trade-off occurs. For example, conventional processing reduces the surface proximity to improve saturation current, which often results in a larger tip height, thus leading to increased short channel effects and reduced on/off speed of the integrated circuit device. Accordingly, precise control over the etching profile of the recesses 254 is desired, particularly precise control over the resulting surface proximity and tip shape of the source and drain regions. The disclosed method 100 provides this desired control, resulting in the etching profile of recesses 254 as described with reference to FIGS. 9A and 9B. In particular, referring to FIGS. 6-7 above, recesses 240 were formed in the source and drain regions of the PFET device to form remaining LDD region 230A, and the recesses 240 were filled with an epi material to form epi features 244. As noted above, the etching profile of the recesses 240 may be controlled to provide a desired profile or shape of the LDD region 230A, and forming the epi features 244 enhances the etching rate between the epi features 244 and the LDD region 230A. The remaining LDD region 230A thus acts as a dry etch slow down and wet etch stop during the etching processes used to form the recesses 254, allowing the LDD region 230A to be designed to achieve a desired surface proximity and tip depth.

Figure 10:
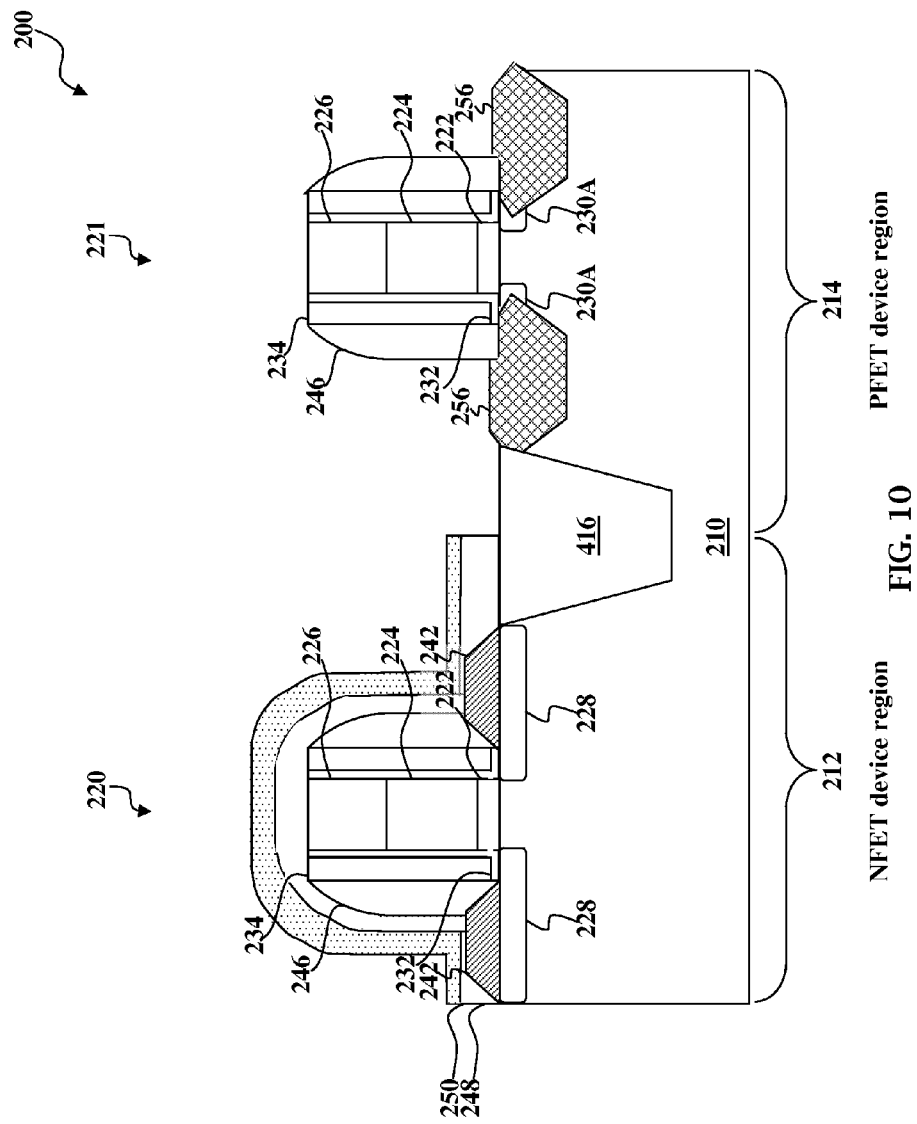

In FIG. 10, a semiconductor material is deposited in the recesses 254 to form a strained structure in the PFET device region 214. In the depicted embodiment, an epitaxy or epitaxial (epi) process is performed to deposit the semiconductor material in the recesses 254. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 210. The deposited semiconductor material is different from the substrate 210. Accordingly, the channel region of the PFET device is strained or stressed to enable carrier mobility of the device and enhance device performance. In the depicted embodiment, the patterned photoresist layer 252 protecting the NFET device region 212 is removed before the epi process. Further, in the depicted embodiment, silicon germanium (SiGe) is deposited by an epi process in the recesses 254 of the substrate 210 to form SiGe source and drain features 256 in a crystalline state on the silicon substrate 210. The SiGe source and drain features 256 may alternatively be referred to as raised source and drain regions. The source and drain features 256 of the PFET device associated with the gate structure 221 may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 256 may further be exposed to annealing processes, such as a rapid thermal annealing process.

Figure 11:
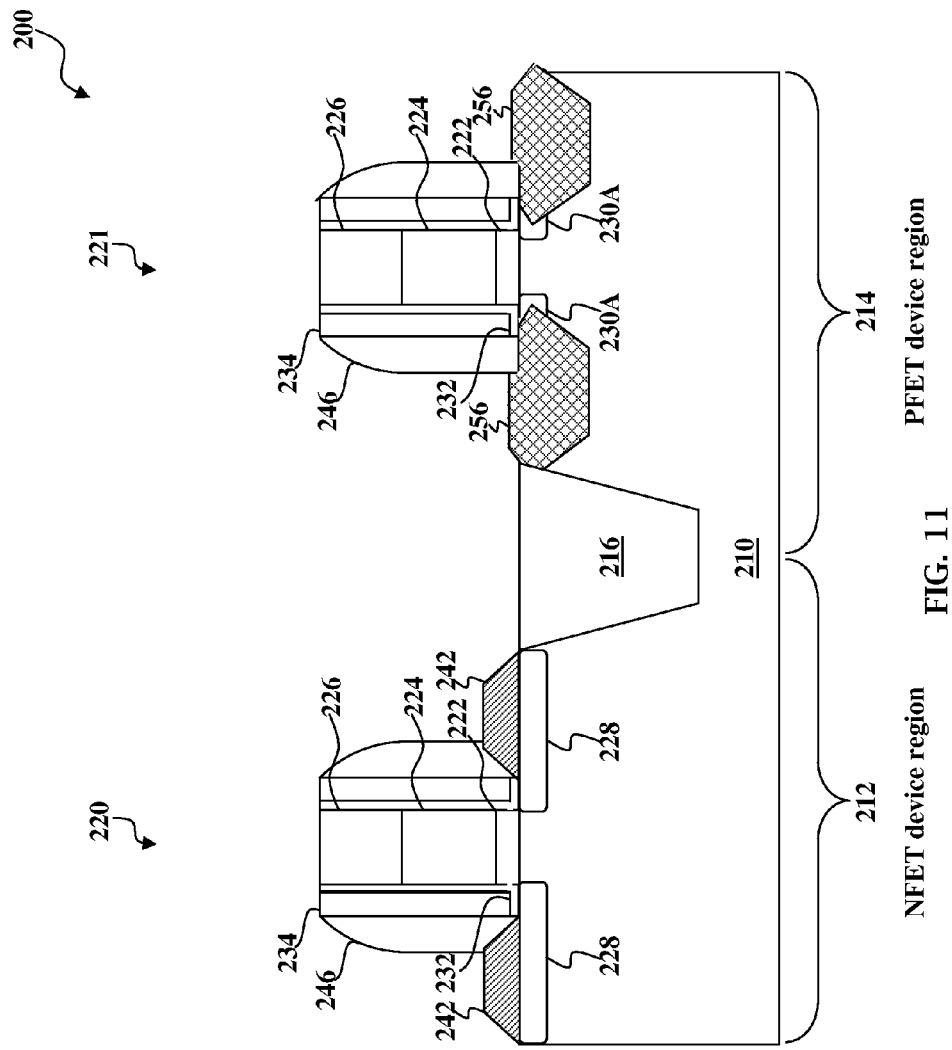

Thereafter, the patterned capping layers 248 and 250 are removed by a suitable process as illustrated in FIG. 11. The integrated circuit device 200 continues with processing to complete fabrication as discussed briefly below. For example, heavily doped source/drain (HDD) regions for the NFET device in the NFET device region 212 may be formed by ion implantation of n-type dopants, such as phosphorous or arsenic, and HDD regions for the PFET device in the PFET device region 214 may be formed by ion implantation of p-type dopants, such as boron. It is understood that the HDD regions of the NFET and PFET device regions 212 and 214 may be formed earlier than in the depicted embodiment. Additionally, silicide features are formed on the raised source/drain regions, for example, to reduce the contact resistance. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structures 220 and 221 before forming the ILD layer. In an embodiment, the gate electrode 224 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate 210 to electrically connect various features or structures of the integrated circuit device 200. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

The integrated circuit device 200 serves only as an example. The integrated circuit device 200 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

In summary, the disclosed method 100 provides improved control over surface proximity and tip depth in the integrated circuit device 200. The improved control is achieved by designing the LDD regions of a device to achieve desired surface proximity and tip depth. In an embodiment, the LDD region is designed by forming a recess in the substrate in the source and drain region of the device, and forming epi features in the recesses. An etching process may be tuned to achieve a desired etching profile of the recess, thereby leaving a desired remaining LDD region. The epi features can enhance etching selectivity, such that the desired LDD region acts as an etch stop when recesses are formed for the raised source and drain regions of the device. It has been observed that the disclosed method and integrated circuit device results in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a semiconductor substrate;
forming a gate structure over the substrate;
forming a lightly doped source and drain (LDD) region in the substrate, the LDD region being interposed by the gate structure;
forming offset spacers on sidewalls of the gate structure;
removing portions of the substrate, including portions of the LDD regions, at either side of the gate structure, thereby forming a first recess in the substrate;
epitaxially (epi) growing a first semiconductor material to fill the first recess, thereby forming epi features;
forming main spacers for the gate structure;
removing portions of the substrate, including portions of the epi features, at either side of the gate structure, thereby forming a second recess in the substrate that defines a source and drain region in the substrate; and
epitaxially (epi) growing a second semiconductor material to fill the second recess, the second semiconductor material being different than the first semiconductor material.

2. The method of claim 1 wherein the forming the LDD region in the substrate includes implanting the substrate with a p-type dopant.

3. The method of claim 2 wherein the epi growing the first semiconductor material includes epi growing silicon and the epi growing the second semiconductor material includes epi growing silicon germanium.

4. The method of claim 1 wherein the forming the first recess includes performing a dry etching process, wherein the dry etching process is tuned, such that a remaining LDD region exhibits a desired profile.

5. The method of claim 1 wherein the forming the second recess includes performing a wet etching process or performing a combination wet and dry etching process.

6. The method of claim 1 wherein the forming the second recess in the substrate that defines the source and drain region includes, for the source region and the drain region, etching a first and second facet in a {111} crystallographic plane of the substrate and a third facet in a {100} crystallographic plane of the substrate.

7. The method of claim 6 wherein the etching the first, second, and third facets includes:
etching an angle of about 45.0° to about 80.0° between the first and second facets; and
etching an angle of about 50.0° to about 70.0° between the second and third facets.

8. The method of claim 1 wherein the forming the second recess in the substrate that defines the source and drain includes etching the substrate such that a top surface of the substrate extends a distance from one of the sidewalls of the gate structure to the second recess, the distance being about 1 nm to about 3 nm.

9. The method of claim 1 wherein the forming the second recess in the substrate that defines the source and drain includes etching substrate such that a distance between a top surface of the substrate and an intersection of the first and second facets is about 5 nm to about 10 nm.

10. A method comprising:
providing a semiconductor substrate having a first region and a second region;
forming first and second gate structures over the substrate in the first and second regions, respectively;

forming first and second lightly doped source and drain (LDD) regions in the first and second regions, respectively;

forming offset spacers on sidewalls of the first and second gate structures;

forming a first recess in the substrate at either side of the second gate structure;

epitaxially (epi) growing a first semiconductor material to fill the first recess and over the first LDD region;

forming main spacers for the first and second gate structures;

forming a second recess in the substrate at either side of the second gate structure; and epitaxially (epi) growing a second semiconductor material to fill the second recess, the second semiconductor material being different than the first semiconductor material.

11. The method of claim 10 wherein the forming the first LDD region includes implanting the substrate with an n-type dopant, and the forming the second LDD region includes implanting the substrate with a p-type dopant.

12. The method of claim 10 wherein the forming the first recess includes:

forming a protection layer over the first region;

performing a dry etching process; and thereafter, removing the protection layer over the first region.

13. The method of claim 12 wherein the performing the dry etching process includes:

removing portions of the substrate and the second LDD region; and tuning etching conditions of the dry etching process, such that a remaining second LDD region exhibits a desired profile.

14. The method of claim 12 wherein the performing the dry etching process includes etching the substrate to a depth of about 15 nm to about 25 nm.

15. The method of claim 10 wherein the forming the second recess includes:

forming a protection layer over the first region;

performing a wet etching process or combination wet and dry etching process; and thereafter, removing the protection layer over the first region.

16. The method of claim 15 wherein the performing the wet etching process includes removing portions of the substrate and the first semiconductor material to define a source region and drain region, the source region and the drain region having a first and second facet in a {111} crystallographic plane of the substrate and a third facet in a {100} crystallographic plane of the substrate.

17. The method of claim 16 wherein the removing portions of the substrate and the first semiconductor material to define the source region and drain region includes:

forming an angle of about 45.0° to about 80.0° between the first and second facets; and forming an angle of about 50.0° to about 70.0° between the second and third facets.

* * * * *